United States Patent [19]

Moyal

[11] Patent Number: 4,972,157
[45] Date of Patent: Nov. 20, 1990

[54] OPERATIONAL AMPLIFIER HAVING SELECTABLE INPUTS

[75] Inventor: Miki Moyal, Austin, Tex.

[73] Assignee: Advanced Micro Devices, Inc., Sunnyvale, Calif.

[21] Appl. No.: 383,914

[22] Filed: Jul. 21, 1989

[51] Int. Cl.[5] ............................................. H03K 17/56
[52] U.S. Cl. ..................................... 330/51; 307/243; 328/154
[58] Field of Search ........................... 330/51; 328/154; 307/243

[56] References Cited

U.S. PATENT DOCUMENTS

| | | | |
|---|---|---|---|
| 3,230,397 | 1/1966 | Linder | 307/243 X |
| 3,522,450 | 8/1970 | Muenter | 307/243 |
| 3,670,148 | 6/1972 | Moses | 328/154 X |
| 3,681,699 | 8/1972 | Kelley et al. | 328/154 X |
| 4,236,088 | 11/1980 | Horiuchi et al. | 307/243 X |
| 4,467,227 | 8/1984 | Lewyn et al. | 307/577 |
| 4,490,626 | 12/1984 | Carlson | 328/154 X |

Primary Examiner—James B. Mullins
Attorney, Agent, or Firm—Foley & Lardner

[57] ABSTRACT

There is disclosed an operational amplifier which is arranged for sensing the voltages provided by a plurality of input voltage sources and which diminishes the level of noise at the operational amplifier output resulting from the selection of the input voltage sources. The operational amplifier includes a first amplification stage having first and second voltage sensing intputs, a common input, and an output, and a second amplification stage having an input and an output. Switch means are disposed between the first stage output and the second stage input for selectively coupling the amplified signal at the first stage output resulting from an input signal at the first input to the second stage input or the amplified signal at the first stage output resulting from an input signal at the second input to the second stage input. Because the switch means is disposed between the first and second amplification stages, the noise coupled into the operational amplifier is not amplified by the first amplification stage and hence, the noise at the output of the operational amplifier is deceased by a factor equal to the gain of the first amplification stage.

5 Claims, 2 Drawing Sheets

OPERATIONAL AMPLIFIER HAVING SELECTABLE INPUTS

BACKGROUND OF THE INVENTION

The present invention is generally directed to operational amplifiers arranged for sensing the input voltages provided by a plurality of input voltage sources. The present invention is more particularly directed to such an operational amplifier which includes an internal switch means for selecting given ones of a plurality of input voltage sources.

Operational amplifiers find considerable use in modern electronic circuitry. Such amplifiers generally include a voltage sensing input, a reference input, and a plurality of amplification stages which provide an output voltage proportional to a sensed input voltage applied across the voltage sensing input and the reference input.

In many applications of operational amplifiers, it is advantageous for an operational amplifier to be used for sensing input voltages derived from a number of different sources. In the past, it has been customary to provide a switch disposed between the various input voltage sources and the voltage sensing input of an operational amplifier to selectively couple the input voltage sources, one at a time, to the voltage sensing input of the operational amplifier.

Operational amplifiers are often utilized in integrated circuits. In order to maintain processing compatibility, the switches, for selecting the input voltage sources, have customarily been solid state switches implemented by employing the same technology as the rest of the circuit in the integrated circuit.

While such arrangements have been generally successful, a problem has existed as a result of the fact that the solid state switches, implemented by a plurality of field-effect transistors, for example, have distributed or parasitic capacitance. The distributed capacitance provides a coupling path which couples noise from the integrated circuit power supply into the input of the operational amplifier. That noise is amplified by the various stages of the operational amplifier and appears at the operational amplifier output. In an open loop configuration, because the first amplification stage of an operational amplifier generally has the highest gain of all the stages and may have a gain of about one-hundred, the noise present at the operational amplifier input resulting from the input switch capacity is amplified by at least a factor of one-hundred. This can limit the utility of such an operational amplifier configuration.

By virtue of the present invention, these problems are overcome by employing the switching for the various input sources internally within the operational amplifier after the first amplification stage. As a result, the noise at the operational amplifier output is reduced by at least a factor equal to the gain of the first amplification stage of the operational amplifier.

It is therefore a general object of the present invention to provide a new and improved operational amplifier configuration which may be utilized for sensing input voltages provided by a plurality of input voltage sources.

It is a further object of the present invention to provide such an operational amplifier configuration wherein the switching between the various input voltage sources is performed after the first amplification stage of the operational amplifier to substantially reduce the resulting noise component at the first amplification stage output, and hence, at the operational amplifier output.

It is a still further object of the present invention to provide such an operational amplifier for use in an integrated circuit wherein the switching means for selecting the various input voltage sources may be compatible with the other circuits of the integrated circuit.

SUMMARY OF THE INVENTION

The present invention provides an operational amplifier including a first amplification stage having first and second voltage sensing inputs, a common input, and an output, and a second amplification stage including an input and an output. The operational amplifier further includes switch means disposed between the first stage output and the second stage input for selectively coupling the amplified signal at the first stage output resulting from an input signal at the first input to the second stage input or the amplified signal at the first stage output resulting from an input signal at the second input to the second stage input.

The present invention further provides an operational amplifier comprising a first amplification stage including a first amplifier portion having a first voltage sensing input and a first output, and a second amplifier portion having a second voltage sensing input and a second output. The first and second amplifier portions have a common input. The operational amplifier further includes a second amplification stage having an input and an output, and switch means coupled between the first amplification stage and the second amplification stage for selectively coupling the first output to the second stage input or the second output to the second stage input.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference characters identify identical elements, and wherein:

DESCRIPTION OF THE PREFERRED EMBODIMENT

Figure 1:
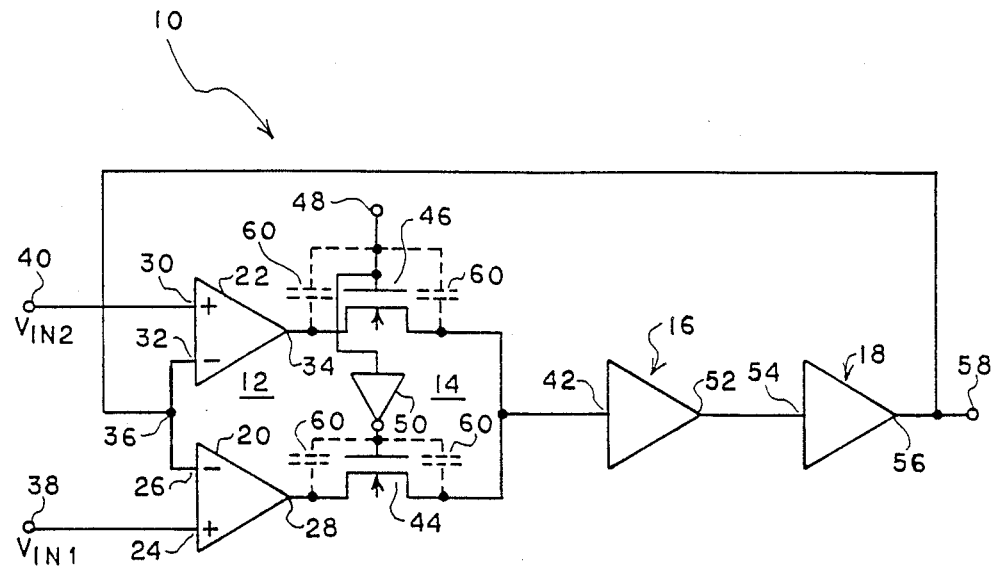
FIG. 1 is a schematic block diagram of an operational amplifier embodying the present invention.

Referring now to FIG. 1, it illustrates, in block diagram form, an operational amplifier 10 embodying the present invention. The operational amplifier 10 generally includes a first amplification stage 12, a switch means 14, a second amplification stage 16, and a third amplification stage 18. The first amplification stage 12 may have a gain of, for example, one-hundred, the second amplification stage 6 may have a gain of, for example, fifty, and the third amplification stage 18 may have a gain of, for example, unity.

The first amplification stage 12 includes first and second amplification substages or portions 20 and 22 respectively. The first amplification portion 20 includes a first voltage sensing input 24, a reference input 26, and a first output 28. The second amplification portion 22 includes a second voltage sensing input 30, a reference input 32, and a second output 34. The reference inputs 26 and 32 are coupled together to form a common input 36 of the operational amplifier 10.

The first voltage sensing input 24 is coupled to a terminal 38 adapted to be coupled to a first input voltage source (not shown). The second voltage sensing input 30 is coupled to a terminal 40 which, in a similar manner, is adapted for connection to a second input voltage source (not shown).

The switch means 14 is coupled between the output of the first amplification stage 12 and an input 42 of the second amplification stage 16. The switch means 14 comprises a solid state switch including N-channel field-effect transistors 44 and 46. Transistor 44 is coupled in series relation between the first output 28 and the input 42 of the second amplification stage 16. In a similar manner, transistor 46 is coupled in series relation between the second output 34 and the input 42 of the second amplification stage 16. The switch means 14 further includes a control input 48 which is coupled directly to the gate of transistor 46 and to the gate of transistor 44 through an invertor 50.

The second amplification stage 16 includes an output 52 which is coupled to an input 54 of the third amplification stage 18. The third amplification stage 18 has an output 56 which is coupled to the output 58 of the operational amplifier 10. In a conventional manner, the output 58 of the operational amplifier is coupled to the common or reference input 36 of the operational amplifier 10 to provide voltage feedback in a unity gain configuration.

In operation, when it is desired to sense the voltage of the first input voltage source at terminal 38, a low-logic level is impressed upon the control input 48. This causes the gate of transistor 46 to be low and the gate of transistor 44 to be high by virtue of the inversion provided by invertor 50. The high-logic level or voltage at the gate of transistor 44 will turn on transistor 44 to couple the first output 28 to the input 42 of the second amplification stage 16. The low voltage at control input 48 causes the transistor 46 to be off so that only the voltage of the first input voltage source coupled to terminal 38 is sensed by the operation amplifier 10.

When the control signal at control input 48 is a high level, the gate of transistor 46 will be at a high level and the gate of transistor 44 will be at a low level by virtue of the inversion provided by invertor 50. This causes transistor 46 to be on and transistor 44 to be off. As a result, under these conditions, only the voltage provided by the second input voltage source coupled to terminal 40 is sensed by the operational amplifier 10.

Of particular note is the fact that the switch means 14 is disposed between the output of the first amplification stage 12 and the input of the second amplification stage 16. As previously mentioned, switch means incorporating solid state switches, such as filed-effect transistors, exhibit distributed or parasitic capacitance shown in the Figure by dashed lines and are referenced by reference character 60. The distributed or parasitic capacitance 60 exists between the sources and gates and drains and gates of the filed-effect transistors. In conventional implementations, switch means similar to switch means 14 have been located at the inputs to the operational amplifier and the parasitic capacitance thereof have provided a path for noise originating in the integrated circuit power supplies between the power supplies and the inputs to the first amplification stage. Hence, in conventional configurations, such noise is amplified by the first amplification stage by a factor equal to its gain, which may be, for example, one-hundred.

By virtue of the fact that the switch means 14 of FIG. 1 is disposed between the output of the first amplification stage 12 and the input of the second amplification stage 16 in accordance with the present invention, the power supply noise is not amplified by the first amplification stage 12. As a result, the noise appearing at the output 58 of the operational amplifier is decreased by a factor equal to the gain of the first amplification stage 12, and, in accordance with this preferred embodiment, by a factor of one-hundred.

Figure 2:
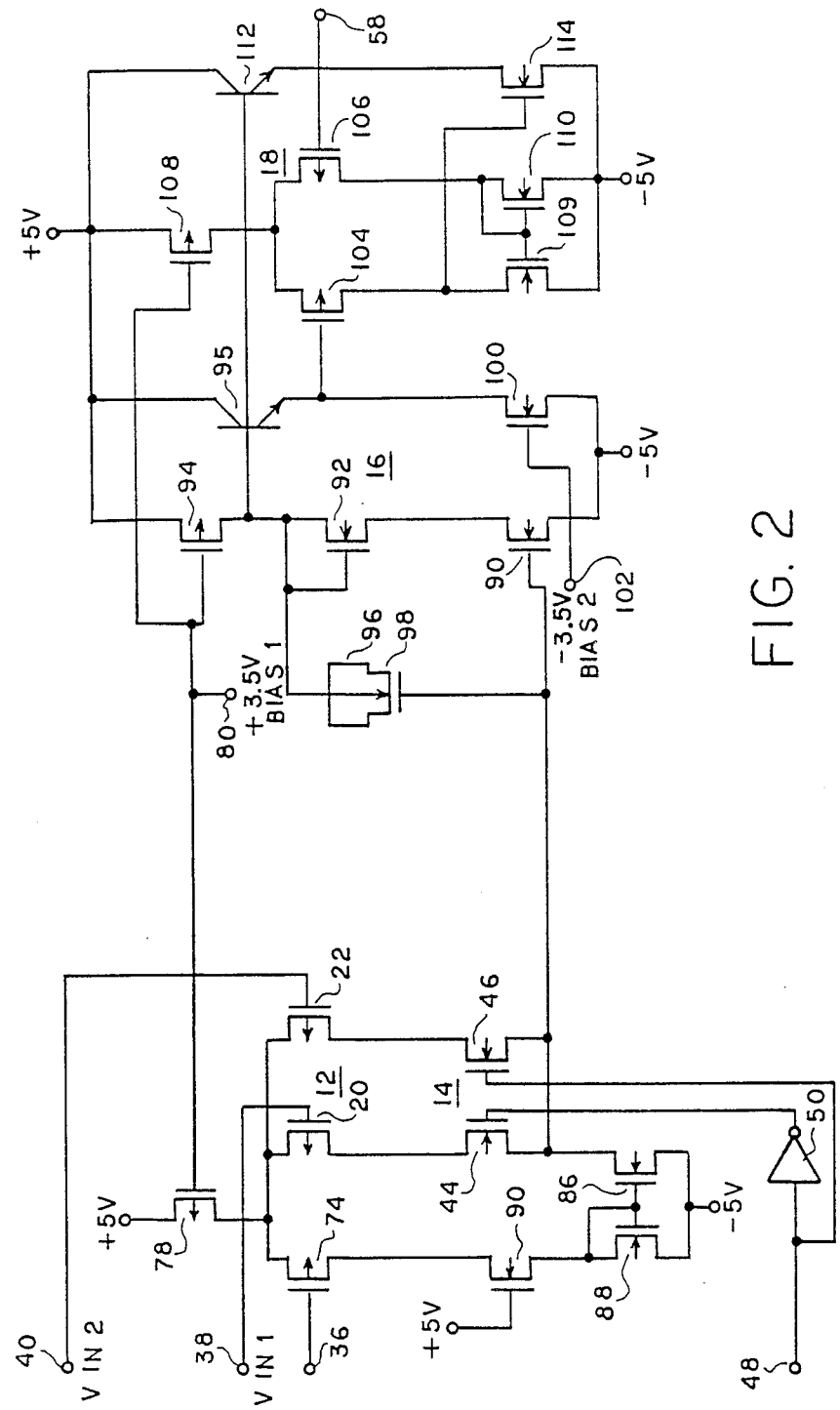
FIG. 2 is a detailed schematic circuit diagram of the operational amplifier illustrated in FIG. 1.

Referring now to FIG. 2, it illustrates, in detail schematic circuit diagram form, a specific implementation of the operational amplifier 10 illustrated in FIG. 1. The operational amplifier 10 of FIG. 2 is particularly adapted for use in a subscriber line audio-interface circuit implemented in integrated circuit form utilizing CMOS technology. To that end, it will be noted that the operational amplifier 10 includes a plurality of N-channel and P-channel field-effect transistors. As will also be seen, the switch means comprises N-channel field-effect transistors so that the implementation of the switch means is achieved in a manner compatible with the processing of the rest of the operational amplifier circuit.

As is customary in CMOS field-effect transistor technology, the bodies of the P-channel field-effect transistors should be coupled to the +5 volt power source and the bodies of the N-channel field-effect transistors should be coupled to the −5 volt power source. These connections are not shown in FIG. 2 so as to not unduly complicate the figure.

In FIG. 2, the reference characters utilized in FIG. 1 are also utilized for indicating like elements. To that end, it can be seen that the operational amplifier 10 of FIG. 2 includes a first amplification stage 12, switch means 14, second amplification stage 16, and third amplification stage 18.

The first amplification stage 12 includes a P-channel field-effect transistor 20 and a P-channel field-effect transistor 22. Transistor 20 forms the first amplification portion of the first amplification stage 12 and the gate of transistor 20 forms the first voltage sensing input of the operational amplifier 10. The gate of transistor 20 is coupled to the terminal 38 for receiving the voltage of the first input voltage source.

Similarly, transistor 22 forms the second amplification portion of the first amplification stage 12 and the gate of transistor 22 forms the second voltage sensing input of the operational amplifier 10. The gate of transistor 22 is coupled to the terminal 40 for receiving the voltage of the second input voltage source.

The sources of transistors 20 and 22 form the reference inputs of the first stage amplifier portions and to that end, the source of transistor 22 is coupled to the source of transistor 20. The sources of transistors 20 and 22 are also coupled to the source of a P-channel field-effect transistor 74. The gate of transistor 74 and is coupled to the common input terminal 36 which is adapted to receive a feedback voltage from the output 58 of the operational amplifier 10. This connection is clearly illustrated in FIG. 1 and is not shown in FIG. 2 so as to not unduly complicate the Figure.

The sources of transistors 20, 22, and 74 are also coupled to a +5 volt power source through a P-channel field-effect transistor 78. The gate of transistor 78 is coupled to a first bias voltage of +3.5 volts applied to a first bias terminal 80. As a result, transistor 78 forms a current source for transistors 20, 22 and 74.

The drains of transistors 20 and 22 form the outputs of the first and second amplification portions of the first amplification stage 12. The drains of transistors 20 and 22 are coupled to the drains of N-channel field-effect transistors 44 and 46 which form the switch means 14. The sources of transistors 44 and 46 are coupled to the drain of N-channel field-effect transistor 86 which forms a load for the first amplification stage 12. The source of transistor 86 is coupled to a −5 volts power source.

To form a complimentary load for the reference input of the operational amplifier, another N-channel field-effect transistor 88 is provided. The drain of transistor 88 is coupled to the drain of transistor 74 through another N-channel field-effect transistor 90. Transistor 90 is always in a conducting state because its gate is coupled to a +5 volt power supply. As can also be noted, the drain and gate of transistor 88 are coupled together, and the gates of transistors 88 and 86 are also coupled together.

To control or select which input voltage source is being sensed, the control input 48 is coupled directly to the gate of transistor 46 and to the gate of transistor 44 through the invertor 50. When the control voltage or signal at terminal 48 is at a low level, transistor 44 will be turned on and transistor 46 will be turned off so that the voltage of the first input voltage source is sensed by the operational amplifier. When the control voltage or signal at terminal 48 is at a high level, transistor 46 will be turned on and transistor 44 will be turned off so that the voltage of the second input voltage source will be sensed by the operational amplifier.

The sources of transistors 44 and 46 are coupled to the gate of an N-channel field-effect transistor 90 for coupling the switch means to the input of the second amplification stage 16. The second amplification stage 16 includes an N-channel field-effect transistor 92 and a bipolar NPN transistor 95. The drain of transistor 92 is coupled to a P-channel field-effect transistor 94 which forms a current source. The source of transistor 94 is coupled to a +5 volt power source and the drain of transistor 94 is coupled to the drain of transistor 92. The gate of transistor 94 is coupled to the first bias supply terminal 80.

The drain of transistor 92 is coupled to the gate of transistor 92 and is also coupled to the gate of transistor of 90 through a capacitor 96. Capacitor 96 is formed by an N-channel field-effect transistor 98 which has its gate coupled to the gate of transistor 90 and its source, drain, and bulk coupled together and to the gate and drain of transistor 92. As also illustrated, the source of transistor 90 is coupled to a −5 volt power source.

The drain of transistor 94 and drain of transistor 92 are coupled to the base of transistor 95. The collector of transistor 95 is coupled to the +5 volt power source and the emitter of transistor 95 is coupled to a current source formed by an N-channel field-effect transistor 100. Transistor 100 has its drain coupled to the emitter of transistor 94, its source coupled to the −5 volt power source, and its gate coupled to a second bias supply terminal 102 to which may be applied a −3.5 volts.

The output of the second amplification stage 16 is formed at the emitter of transistor 95 and is coupled to the third amplification stage at the gate of a P-channel field-effect transistor 104. The third amplification stage also includes another P-channel field-effect transistor 106 which has its source coupled to the source of transistor 104 and to the +5 volt power source through a current source formed by a P-channel field-effect transistor 108 which has its gate coupled to bias terminal 80.

The third amplification stage further includes N-channel field-effect transistors 109 and 110 which form loads for the third amplification stage. Transistor 109 is coupled between the drain of transistor 104 and the −5 volt power source. Similarly, transistor 110 is coupled between the drain of transistor 106 and the −5 volt power source. The gates of transistors 109 and 110 are coupled together. The gate of transistor 110 is also coupled to its drain.

To complete the description of the operational amplifier 10, the third amplification stage further includes the bipolar NPN transistor 112 and an N-channel field-effect transistor 114. The collector of transistor 112 is coupled to the +5 volt power source, the base of transistor 112 is coupled to the base of transistor 95 and the emitter of transistor 112 is coupled to the gate of transistor 106 and to the output 58 of the operational amplifier. The output of the operational amplifier is coupled to the drain of transistor 114 and the source of transistor 114 is coupled to the −5 volt power source.

The operation of the operational amplifier of FIG. 2 is identical to the operation of the operational amplifier of FIG. 1 as previously described. Like the operational amplifier of FIG. 1, the switch means 14 is disposed between the first amplification stage 12 and the second amplification stage 16. The first input voltage source is selected when a low logic level signal is applied to control input 48 and the second input voltage source is selected when a high level signal is applied to the control input 48.

By virtue of the fact that the switch means 14 is disposed between the first amplification stage 12 and the second amplification stage 16, the noise from the integrated circuit power source will not be amplified by the first amplification stage. As a result, the noise appearing at the output 58 of the operational amplifier is accordingly decreased by a factor equal to the gain of the first amplification stage, and in accordance with this preferred embodiment, is decreased by a factor of one-hundred.

From the foregoing, it can be seen that the present invention provides a new and improved operational amplifier which is arranged to sense the voltage provided by a plurality of input voltage sources. Because the switch means of the operational amplifier of the present invention is not disposed at the input to the operational amplifier, the noise coupled into the operational amplifier by the switch means is not amplified by the first amplification stage. In contrast, because the switch means is disposed between the first amplification stage and the second amplification stage, the noise coupled into the operational amplifier by the switch means is not amplified by the first amplification stage and as a result, the noise appearing at the operational amplifier output is decreased by a factor equal to the gain of the first amplification stage.

While a particular embodiment of the present invention has been shown and described, modifications may be made, and it is thereof intended to cover all such changes and modifications which fall within the true spirit and scope of the invention.

What is claimed is:

1. An operational amplifier comprising:

an output;

a first amplification stage including first and second voltage sensing inputs, a common input and an output, said first amplification stage comprising first and second amplification substages, each said substage including a first input, a second input and an output wherein said second substage inputs are coupled together to form said common input, wherein said first substage first input comprises said first amplification stage first voltage sensing input, and wherein said second substage first input comprises said first amplification stage second voltage sensing input;

a second amplification stage including an input and an output, said second amplification stage output being coupled to said output;

switch means disposed between said first amplification stage output and said second amplification stage input for selectively coupling said first substage output to said second amplification stage input or said second substage output to said second amplification stage input, said switch means comprising first and second field-effect transistors wherein said first field-effect transistor is coupled between said first substage output and said second amplification stage input and wherein said second field-effect transistor is coupled between second substage output and said second amplification stage input;

a control input and an inverting means, said control input being coupled directly to the gate of said first field-effect transistor and said control input being coupled to the gate of said second field-effect transistor through said inverting means; and a third amplification stage having an input and an output, said third amplification stage input being coupled to said second amplification stage output, and said third amplification stage output comprising the output of said operational amplifier and being coupled to said first amplification stage common input.

2. An operational amplifier comprising:

an output;

a first amplification stage including a first amplifier portion having a first voltage sensing input and a first output, and a second amplifier portion having a second voltage sensing input and a second output, said first and second amplifier portions having a common input;

a second amplification stage having an input and an output;

a third amplification stage having an input coupled to said second stage output and an output coupled to said output; and switch means coupled between said first amplification stage and said second amplification stage for selectively coupling said first output to said second stage input or said second output to said second stage input, said output being coupled to said first amplification stage common input.

3. An operational amplifier as defined in claim 2 further comprising a control input coupled to said switching means for controlling said selective coupling by said switch means.

4. An operational amplifier as defined in claim 3 wherein said switch means comprises solid state switch means.

5. An operational amplifier as defined in claim 4 wherein said switch means comprises a plurality of field-effect transistors.

* * * * *